(12) United States Patent
Darzy

(10) Patent No.: US 6,879,213 B2
(45) Date of Patent: Apr. 12, 2005

(54) RAIL TO RAIL CLASS AB OUTPUT FOR AN AMPLIFIER

(75) Inventor: Saul Darzy, Edgeware (GB)

(73) Assignee: STMicroelectronics Limited (GB)

( * ) Notice: Subject to any disclaimer, the term of this patent is extended or adjusted under 35 U.S.C. 154(b) by 0 days.

(21) Appl. No.: 10/413,499

(22) Filed: Apr. 11, 2003

(65) Prior Publication Data

US 2004/0027201 A1 Feb. 12, 2004

(30) Foreign Application Priority Data

Apr. 12, 2002 (EP) .......................................... 02252623

(51) Int. Cl.[7] ............................................... H03F 3/26
(52) U.S. Cl. ....................................... 330/267; 330/255
(58) Field of Search ................................ 330/255, 262, 330/267, 273

(56) References Cited

U.S. PATENT DOCUMENTS

| | | | |
|---|---|---|---|
| 3,437,945 A | | 4/1969 | Duncan ....................... 330/13 |
| 4,570,128 A | * | 2/1986 | Monticelli .................. 330/267 |
| 5,689,211 A | * | 11/1997 | Embree ...................... 330/267 |
| 2003/0042982 A1 | * | 3/2003 | Yasukouchi et al. ........ 330/267 |

FOREIGN PATENT DOCUMENTS

WO   WO 00/25420   5/2000

OTHER PUBLICATIONS

Jager, et al., "A New Class AB– Design", *Electronics World and Wireless World*, Reed Business Publishing, Sutton, Surrey, GB, vol. 105, No. 1764, pp. 982–987, dated Dec. 1999, XP000949682.

Wadsworth, D.C., "The Performance and Applications of a New Current Conveyor Integrated Circuit", *Proceedings of the International Symposium on Circuits and Systems*, New Orleans, May 1–3, 1990, New York, IEEE, U.S. vol. 1 Conf. 23, pp. 287–290, dated May 1, 1990, XP000166843.

European Search Report, 02252623.0–2215, dated Sep. 26, 2002.

* cited by examiner

*Primary Examiner*—Khanh V. Nguyen
(74) *Attorney, Agent, or Firm*—Jenkens & Gilchrist, PC

(57) ABSTRACT

A circuit is used in the output stage of an operational amplifier which allows a rail to rail swing of the output voltage while consuming low quiescent power. The circuit includes first and second control elements each having a controllable path and a control node. The circuit further includes a third control element having a controllable path connected between the control nodes of the first and second control elements via a resistive path. A voltage indicative of an input signal is applied to a node of the resistive path. Current flow through the controllable paths of the first and second control elements changes in response to changes in the voltage at the node. More specifically, current flow through the controllable path of the second control element changes in dependance on the current flow through the controllable path of the third control element. Additionally, as one of the first and second control elements is turned on, the other control element is held off.

19 Claims, 3 Drawing Sheets

RAIL TO RAIL CLASS AB OUTPUT FOR AN AMPLIFIER

CROSS REFERENCE

The present application claims foreign priority from European Application No. 02252623.0 filed Apr. 12, 2002, the disclosure of which is hereby incorporated by reference.

BACKGROUND OF THE INVENTION

1. Technical Field of the Invention

The present invention relates to a circuit used in the output stage of an operational amplifier.

2. Description of Related Art

An operational amplifier is constructed from a differential amplifier input stage, an intermediate high gain voltage amplifier stage and an output stage.

The output stage of operational amplifier circuits is designed to consume a low quiescent power and provide a high output power, providing an output voltage which can swing from rail to rail.

Output stages are classified into various types. Class A emitter follower stages output a voltage which varies linearly with the driving voltage, however this class of output stage often consumes a large quiescent current. Class B output stages are designed so that a source transistor and a sink transistor are connected so that both transistors cannot conduct at the same time. As with Class A output stages, Class B output stages provide a fairly linear signal response, however, Class B arrangements have crossover distortion at the point where both the sink and source transistors are off.

Class AB complimentary pair output stages are the most commonly used type of output stage. Class AB output stages comprise a source transistor and a sink transistor connected to the driving voltage with biasing circuitry. A Class AB output stage circuit is described in U.S. Pat. No. 5,825,228. This patent describes an output stage comprising a directly driven sink transistor and a sourcing transistor driven through a separate path. The sourcing path comprises an isolation transistor coupled to an NPN transistor configured as a common emitter amplifier that inverts the drive signal. A PNP transistor, connected to the collector of the NPN transistor across a diode, drives the source transistor. Since this configuration includes several common emitter stages in the path for controlling the sourcing transistor, the voltage gain will be higher when sourcing current.

It is an aim of the present invention to provide output stage circuits that provide a high output power, providing an output voltage which can swing substantially from rail to rail with low quiescent current and which overcome the disadvantages of the prior art.

SUMMARY OF THE INVENTION

According to a first aspect of the present invention there is provided an output stage of an amplifier comprising: first and second control elements each having a controllable path and a control node; a third control element having a controllable path connected between said control nodes of said first and second control elements via a resistive path; said resistive path having a node for receiving a voltage indicative of a signal input to the amplifier; wherein current flow through the controllable path of said first control element and said third control element changes in response to a change in the voltage at said node; and wherein current flow through said controllable path of said second control element changes in dependence on the said current flow through the controllable path of said third control element, whereby as one of the first and second control elements is turned on, the other is held off.

Thus, the present invention provides an output stage for an amplifier which allows a rail to rail swing of the output voltage while consuming low quiescent power.

According to a second aspect of the present invention there is provided an amplifier circuit having an output stage, said output stage comprising: first and second control elements each having a controllable path and a control node; a third control element having a controllable path connected between said control nodes of said first and second control elements via a resistive path; said resistive path having a node for receiving a voltage indicative of a signal input to the amplifier; wherein current flow through the controllable path of said first control element and said third control element changes in response to a change in voltage at said input node; and wherein current flow through said controllable path of said second control element changes in dependence on said current flow through the controllable path of said third control element, whereby as one of the first and second control elements is turned on, the other is held off.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
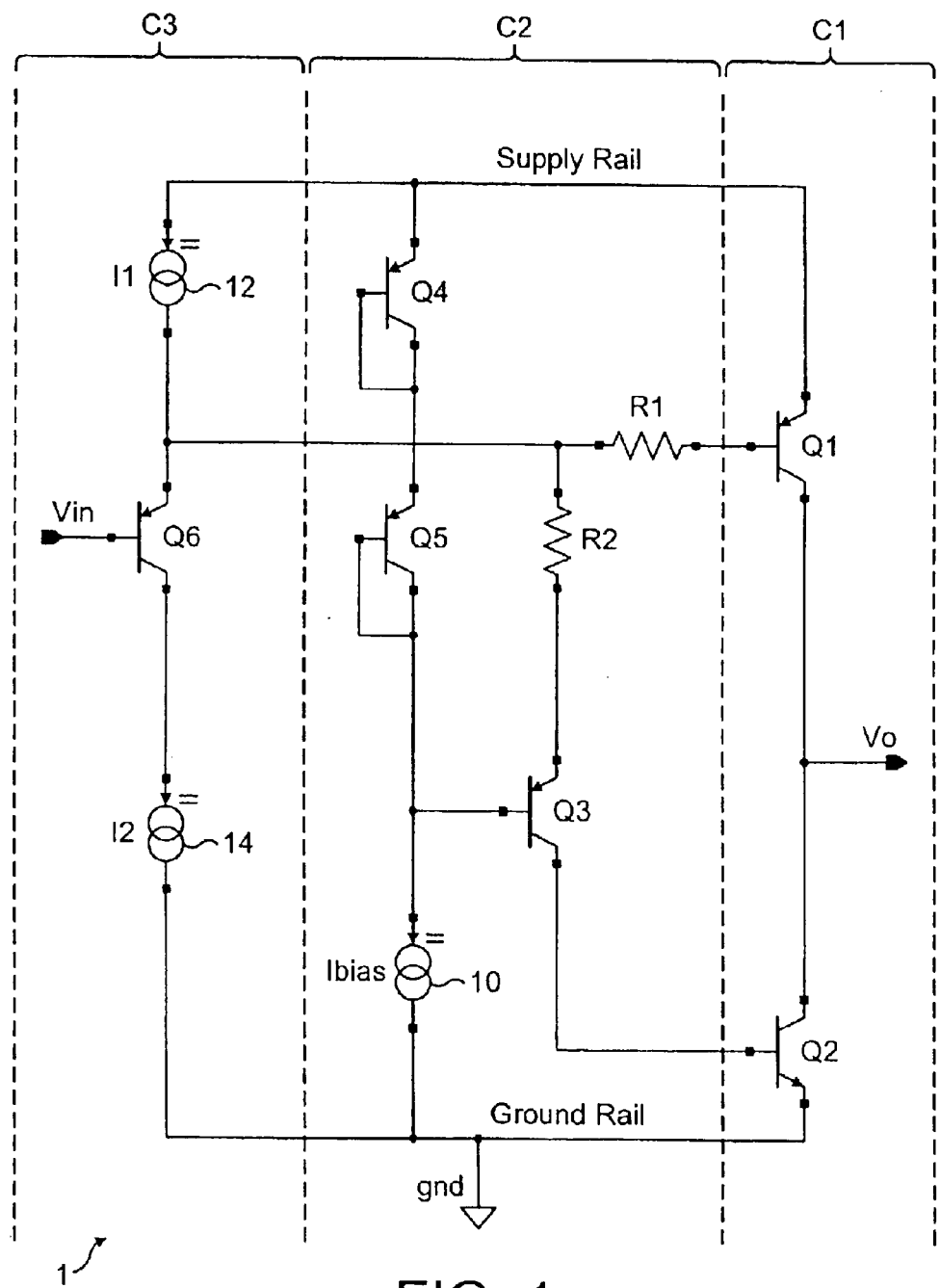
FIG. 1 shows a circuit diagram of an output stage of an operational amplifier according to an embodiment of the present invention.

FIG. 1 shows a circuit diagram of an output stage of an operational amplifier according to an embodiment of the present invention. This circuit 1 comprises three sections; an output section C1 comprising transistors Q1 and Q2, connected in a class AB complementary pair arrangement; a biasing section C2 comprising transistors Q3, Q4 and Q5 and a current sink 10 having a current sink value I bias; and thirdly a driving section C3 comprising transistor Q6, a current source 12 having a current value I1 and a current sink 14 having a current sink value I2.

The collector of pnp transistor Q1 is connected to the collector of npn transistor Q2. The emitters of Q1 and Q2 are connected to the voltage supply rail and ground rail respectively. The output voltage Vo of the circuit is provided at a node between the collectors of Q1 and Q2. The base of Q1 is connected to the emitter of Q6 across resistor R1. R1 is also connected in series with resistor R2, which is connected to the emitter of pnp transistor Q3. The collector of transistor Q3 is connected to the base of transistor 02. The base of transistor Q3 is connected to the current sink 10. Connected in series with the current sink 10 are diode connected pnp transistors Q4 and Q5. The emitter of Q4 is connected to the voltage supply rail, while the collector of Q4 is connected to its base and to the emitter of transistor Q5. The collector of Q5 is connected to its base and to the current sink 10. A current source 12 is connected to the emitter of the transistor Q6. The collector of Q6 is connected to the current sink 14. The current sink 14 sinks a current which is greater in magnitude than sourced by the current source 12. The driving voltage of the circuit Vin is received at the base of transistor Q6.

The operation of circuit 1 shall now be discussed. Output transistors Q1 and Q2 are connected either side of the output voltage node Vo, in order to allow the value of the output voltage to swing as close as possible between the value of the supply rail and the value of the ground rail. When the driving voltage supplied at the base of Q6 is low, the base emitter voltage of transistor Q6 increases and becomes operational. This allows current to flow from the base of transistor Q1, thus turning on Q1. The collector emitter voltage across Q1 decreases as Q1 provides a source current to the voltage output node Vo. The base current of Q1 can increase to I2–I1. Hence the maximum source current supplied by Q1 will be.

$$I\text{source} = (I2-I1) \times \beta_{pnp} \tag{1}$$

where $\beta_{pnp}$ is the current gain of transistor Q1.

When transistors Q6 and Q1 are on, the voltage at the emitter of Q3 drops. This forces Q3 and Q2 into cut off. The voltage drop across R1 further reduces the base emitter voltage of Q3, thus ensuring that virtually no current flows through transistor Q2. This allows the value of the output voltage to be closer to that of the supply voltage. This effect is further enhanced when the load connected at the output voltage node $V_o$ is a capacitor.

When the driving voltage at the base of transistor Q6 increases, Q6 will be off. Instead of flowing through transistor Q6, the current provided by current source 12 is redirected through resistor R2. The rise in voltage at the node between resistors R1 and R2 results in an increase in the base emitter voltage of transistor Q3 and a decrease in the base emitter voltage of Q1. Q3 therefore becomes operational as Q1 is turned off. The voltage drop across R2 will further reduce the base emitter voltage of Q1, ensuring that virtually no current flows through Q1.

When transistor Q3 becomes operational, a maximum current I1 is supplied from the collector of Q3 to drive the base of Q2. Q2 thus provides a sink current equal to:

$$I\text{sink} = I1 \times \beta_{pnp} \tag{2}$$

where $\beta_{pnp}$ is the current gain of Q2.

Providing this sink current at Q2, whilst ensuring that effectively no current flows through Q1, allows the value of the output voltage to be close to the value of the ground rail.

The quiescent current $I_Q$ of the above arrangement is determined according to the following equation:

$$I_Q = I_{BIAS} \times \sqrt{\frac{A_{Q1}A_{Q3} \times \beta_{npn}}{A_{Q4}A_{Q5}}} \tag{3}$$

assuming $\beta_{pnp} < \beta_{pnp}$ and $R_1 = R_2 = 0$; and where A is the emitter area of the transistor.

In practice the value of $I_Q$ will be lower since $R_1$ and $R_2$ are not equal to zero.

Figure 2:
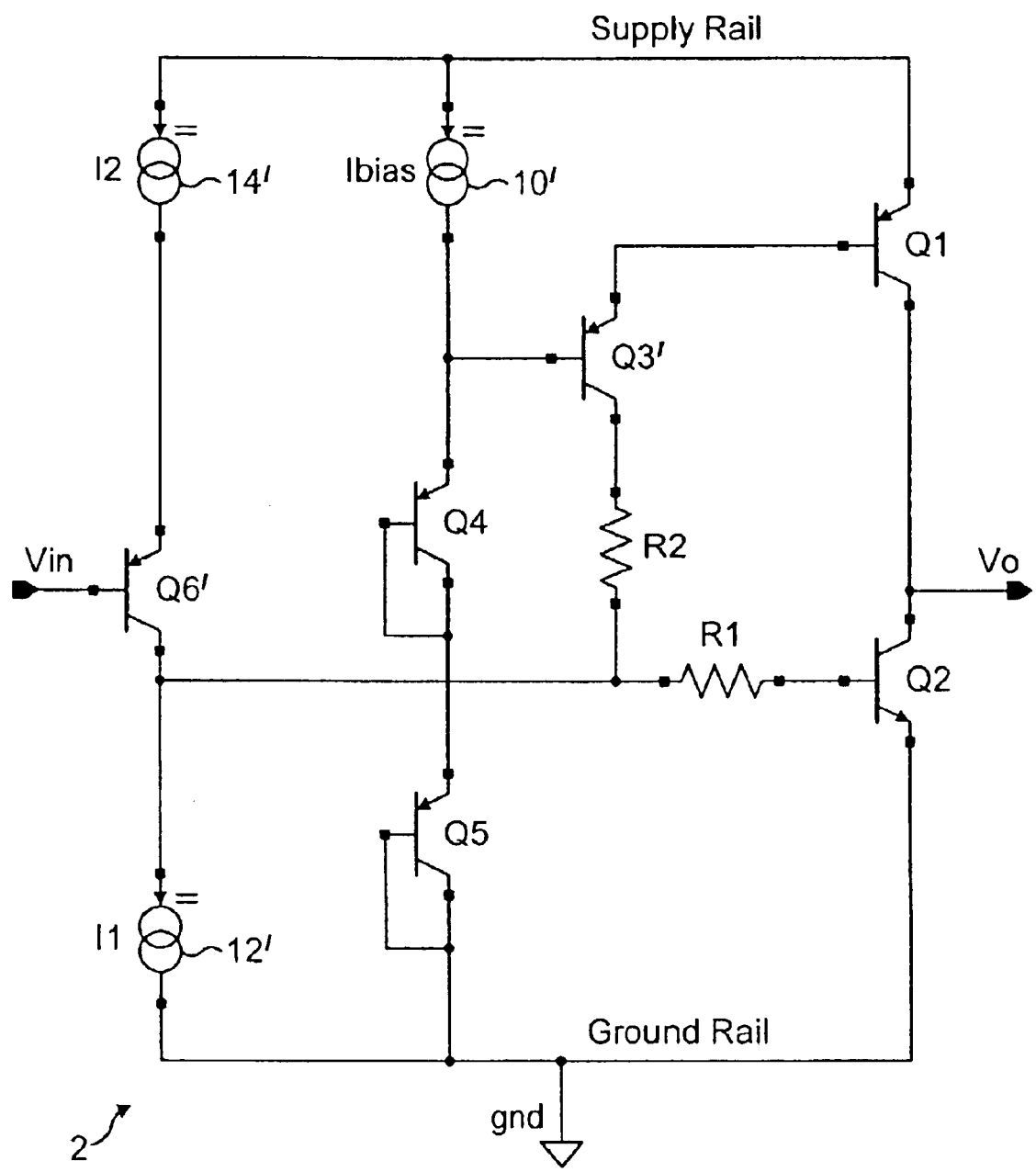
FIG. 2 shows a circuit diagram of an output stage of an operational amplifier according to an alternative embodiment of the present invention.

Reference is now made to FIG. 2. This embodiment of the present invention varies from that of FIG. 1 in that transistor Q2 which provides the sink current is driven directly by the driving transistor Q6', whilst Q1, which provides the source current is driven by Q3'. Driving transistors Q3' and Q6' in this embodiment are npn transistors. The I bias current supplied at the base of transistor Q3' is now provided by a current source 10'. The current of magnitude I2 is now supplied by current source 14', connected to the collector of transistor Q6' while the current of magnitude I1 is now provided by current sink 12' connected to the emitter of Q6.

The operation of circuit 2 shall now be explained. As with circuit 1, the output transistors Q1 and Q2 again provide the source and sink current respectively to the voltage output node $V_o$. When the driving voltage supplied at the base of transistor Q6' is low, the base emitter voltage of Q6' decreases, switching off Q6'. This reduces the current which flows along the drive path connecting the emitter of Q6' to the base of the sink transistor Q2. The voltage will drop at the base of the emitter of transistor Q2, turning Q2 off. The voltage drop at the emitter of Q3' increases the base emitter voltage of Q3', turning Q3' on. This causes Q1 to switch on and source current to output voltage node $V_o$. This source current is equal to:

$$I_{Q1} = I_{Q3} \times \beta_{pnp} \tag{4}$$

The voltage drop across resistor R2 further reduces the base emitter voltage of Q2, ensuring that substantially no current flows through Q2 and therefore allowing the output voltage to be close to the voltage of the supply rail.

When the driving voltage at the base of the emitter of Q6' is high, the base emitter voltage of Q6 will be high and therefore Q6' will be on. The voltage at the base of the sink transistor Q2 will then increase which causes Q2 to become operational and sink current from the output node $V_o$. The sink current being equal to:

$$I_{Q2} = (I_2 - I_1) \times \beta_{pnp} \tag{5}$$

The increase in voltage at the emitter of the Q3' reduces the base emitter voltage of Q3', switching Q3', and accordingly Q1 off. The voltage drop across resistor R1 further reduces the base emitter voltage of Q3, thus ensuring that substantially no current flows through Q1. This allows the output voltage to reach a voltage which is close to the voltage of the ground rail.

The quiescent current $I_Q$ of the arrangement of FIG. 2 is determined according to the following equation:

$$I_Q = I_{BIAS} \times \sqrt{\frac{A_{Q2}A_{Q3} \times \beta_{npn}}{A_{Q4}A_{Q5}}} \tag{6}$$

where A is the emitter area of the transistor.

In both circuit 1 and circuit 2, when the voltage input to the base of the driving transistor Q6/Q6' is high, the sink transistor is driven. Conversely, when the voltage input to the base of the driving transistor Q6/Q6' is low the source transistor is driven. Since both circuits respond to the input voltage in the same way, the circuits may be used interchangeably with the same amplifier circuit.

Figure 3:
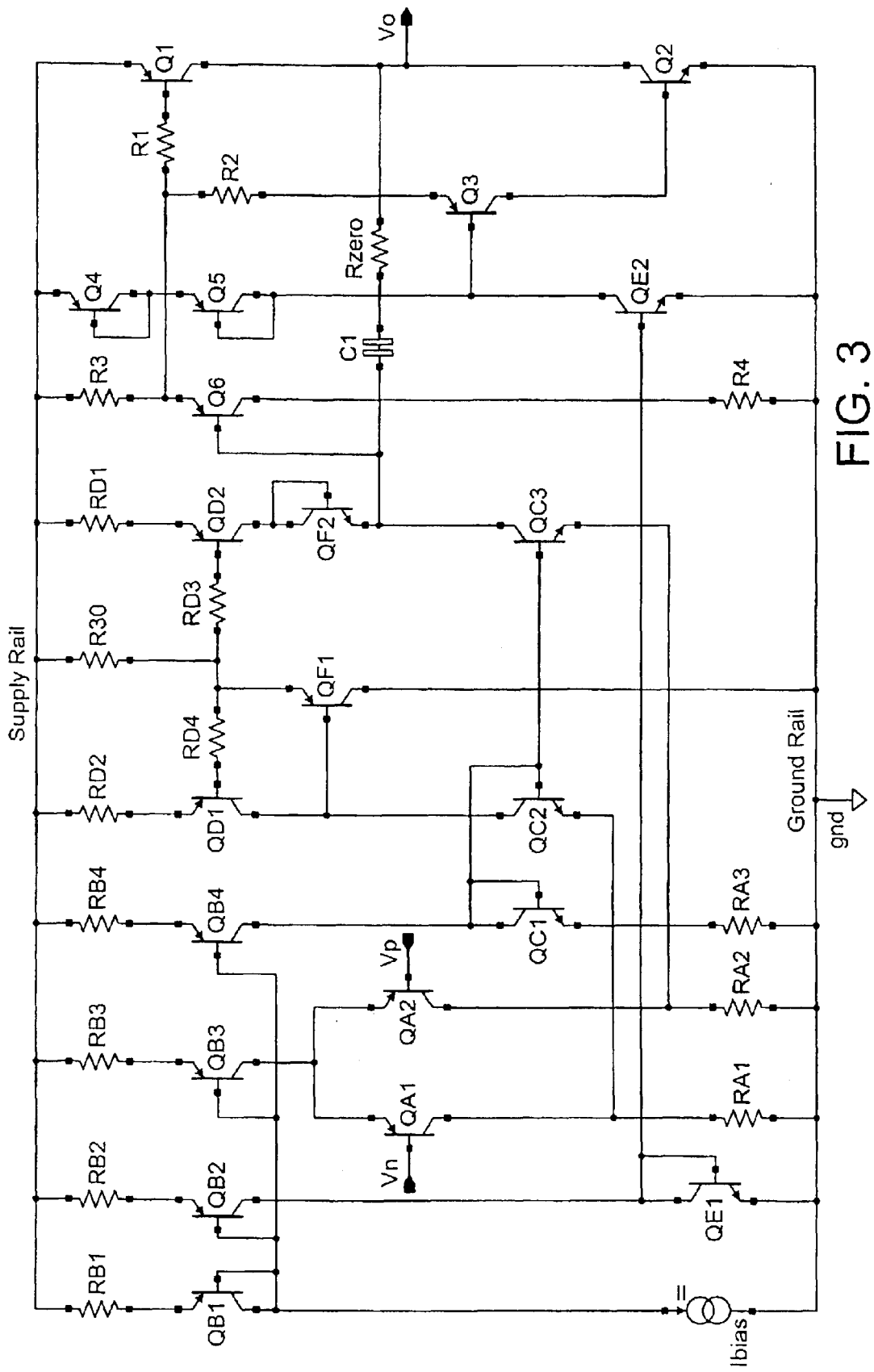
FIG. 3 shows a circuit diagram of an operational amplifier including an output stage according to the first embodiment of the present invention.

An amplifier circuit incorporating the embodiment of the invention as shown in circuit 1 is shown in FIG. 3. The operation of an amplifier is well known in the art and will therefore not be described herein. In this diagram, the current source 12 providing a current I1 is replaced with the resistor R3. In this case, the current source will be equal to:

$$I1 = V_{Q1BE}/R3 \tag{7}$$

where $V_{Q1BE}$ is equal to the base emitter voltage of transistor $Q_1$. Also the current sink 14 sinking a current |2 is replaced with the resistor R4. The current sink will therefore be equal to:

$$I2 = (V(\text{supply}) - V_{Q1BE} - V_{Q1CE,SAT})/R4 \tag{8}$$

where V(supply) is the supply voltage and $V_{QICE,SAT}$ is the saturated collector emitter voltage of $Q_1$.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An output stage of an amplifier comprising:
    first and second control elements each having a controllable path and a control node;
    a third control element having a controllable path connected between said control nodes of said first and second control elements via a resistive path;
    said resistive path having a node for receiving a voltage indicative of a signal input to the amplifier;
    wherein current flow through the controllable path of said first control element and said third control element changes in response to a change in the voltage at said node; and
    wherein current flow through said controllable path of said second control element changes in dependence on the said current flow through the controllable path of said third control element, such that as one of the first and second control elements is turned on, the other is held off.

2. The output stage of an amplifier according to claim 1 wherein said first control element provides a source current and said second control element provides a sink current.

3. The output stage of an amplifier according to claim 1 wherein said first control element provides a sink current and said second control element provides a source current.

4. The output stage of an amplifier according to claim 1 wherein said control elements are bipolar transistors.

5. The output stage of an amplifier according to claim 1 wherein the resistive path includes a resistive element connected between said input node and said control node of said first control element.

6. The output stage of an amplifier according to claim 1 wherein the resistive path includes a resistive element connected between said input node and said third control element.

7. The output stage of an amplifier according to claim 1 further comprising a fourth control element having a controllable path connected to said node of said resistive path and a control node connected to receive the input signal, whereby the voltage at said node varies in dependence on said input signal.

8. The output stage of an amplifier according to claim 1 further having an output node connected between said first and second control elements; wherein said output node receives a source current from one of said first or second control elements and a sink current from the other of said first or second control elements.

9. An operational amplifier including the output stage of claim 1.

10. The output stage according to claim 1 wherein the output stage provides for class AB operation.

11. An output stage of an amplifier, comprising:
    an input node;
    an output node;
    a source transistor connected between a supply rail and the output node and having a first control terminal;
    a sinking transistor connected between the output node and a ground rail and having a second control terminal;
    a control transistor coupled between the first and second control node and defining a path with an intermediate node, the control transistor having a third control terminal;
    an input transistor coupled between the supply rail and the ground rail and having a fourth control terminal that is connected to the input node, the input transistor coupling the input node to the intermediate node; and
    a biasing circuit coupled between the supply rail and the ground rail to supply a bias to the third control terminal;
    wherein the defined path between the first and second control node includes a pair of series connected resistances, the intermediate node comprising the series connection point between those resistances.

12. The output stage as in claim 11 wherein the biasing circuit comprises at least one diode circuit connecting the third control terminal to the supply rail and a current sink connecting the third control terminal to the ground rail.

13. The output stage as in claim 11 wherein the biasing circuit comprises at least one diode circuit connecting the third control terminal to the ground rail and a current source connecting the third control terminal to the supply rail.

14. The output stage as in claim 11 wherein the input transistor couples the input node to the intermediate node through an emitter terminal of the input transistor.

15. The output stage as in claim 11 wherein the input transistor couples the input node to the intermediate node through a collector terminal of the input transistor.

16. The output stage as in claim 11 wherein the output stage operates in a class AB manner.

17. An operational amplifier including the output stage of claim 11.

18. An output stage for an operational amplifier circuit, comprising:
    an output section comprising a class AB complementary pair of transistors connected to an output node;
    a biasing section comprising a bias transistor coupled between control terminals of the complementary pair of transistors;
    a drive section receiving at its input a drive voltage and operating:
        in response to decreasing drive voltage by drawing current from the control terminal of a first one of the complementary pair of transistors to allow current to be supplied to the output node while turning off the bias transistor and preventing a second one of the complementary pair of transistors from sinking current from the output node; and
        in response to increasing drive voltage by supplying current toward the control terminal of the first one of the complementary pair of transistors to prevent current from being supplied to the output node while turning on the bias transistor and allowing the second one of the complementary pair of transistors to sink current from the output node.

19. An output stage for an operational amplifier circuit, comprising:
    an output section comprising a class AB complementary pair of transistors connected to an output node;
    a biasing section comprising a bias transistor coupled between control terminals of the complementary pair of transistors;
    a drive section receiving at its input a drive voltage and operating:
        in response to decreasing drive voltage by drawing current from the control terminal of a second one of the complementary pair of transistors to prevent the sinking of current from the output node while turning on the bias transistor and allowing a first one of the complementary pair of transistors to supply current to the output node; and
        in response to increasing drive voltage by supplying current toward the control terminal of the second one of the complementary pair of transistors to allow sinking of current from the output node while turning off the biasing transistor to prevent the first one of the complementary pair of transistors from supplying current to the output node.

* * * * *